United States Patent
Bera et al.

(10) Patent No.: US 11,189,502 B2
(45) Date of Patent: Nov. 30, 2021

(54) SHOWERHEAD WITH INTERLACED GAS FEED AND REMOVAL AND METHODS OF USE

(71) Applicant: Applied Materials, Inc., Santa Clara, CA (US)

(72) Inventors: Kallol Bera, Fremont, CA (US);
Shahid Rauf, Pleasanton, CA (US);
James Carducci, Sunnyvale, CA (US);
Vladimir Knyazik, Santa Clara, CA (US); Anantha K. Subramani, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 44 days.

(21) Appl. No.: 16/376,367

(22) Filed: Apr. 5, 2019

(65) Prior Publication Data

US 2019/0311920 A1    Oct. 10, 2019

Related U.S. Application Data

(60) Provisional application No. 62/654,518, filed on Apr. 8, 2018.

(51) Int. Cl.
*H01J 31/32* (2006.01)
*H01L 21/67* (2006.01)
*H01L 21/02* (2006.01)
*H01H 1/46* (2006.01)
*H01J 37/32* (2006.01)

(52) U.S. Cl.
CPC .... *H01L 21/67017* (2013.01); *H01J 37/3244* (2013.01)

(58) Field of Classification Search
CPC .......... H01L 21/67017; H01L 21/67207; H01L 21/02263; H01J 37/3244; H01J 37/32174; C23C 16/503–509; H05H 1/46
USPC ....... 118/723 E; 156/345.33, 345.34, 345.43, 156/345.44, 345.45
See application file for complete search history.

(56) References Cited

U.S. PATENT DOCUMENTS

| | | | |
|---|---|---|---|
| 9,328,419 B2 | 5/2016 | Cheng et al. | |
| 9,340,875 B2 | 5/2016 | Pan et al. | |
| 10,253,412 B2 | 4/2019 | Thomas et al. | |
| 2004/0003777 A1* | 1/2004 | Carpenter | C23C 16/45544 118/715 |
| 2011/0256729 A1* | 10/2011 | Goodlin | H01L 21/02104 438/758 |
| 2012/0024478 A1 | 2/2012 | Huang et al. | |
| 2012/0108072 A1 | 5/2012 | Angelov et al. | |
| 2013/0133579 A1 | 5/2013 | Fang et al. | |
| 2013/0220222 A1 | 8/2013 | Huang et al. | |
| 2013/0269612 A1 | 10/2013 | Cheng et al. | |

(Continued)

FOREIGN PATENT DOCUMENTS

WO    2018/028872 A1    2/2018

*Primary Examiner* — Rudy Zervigon
(74) *Attorney, Agent, or Firm* — Servilla Whitney LLC

(57) ABSTRACT

Gas distribution modules comprising a housing with an upper plenum and a lower plenum are described. One of the upper plenum and lower plenum is in fluid communication with an inlet and the other is in fluid communication with an outlet. A plurality of upper passages connects the upper plenum to the bottom of the housing to allow a flow of gas to pass through and be isolated from the first plenum.

20 Claims, 6 Drawing Sheets

(56) References Cited

U.S. PATENT DOCUMENTS

2016/0160351 A1\* 6/2016 Seo ................... C23C 16/45565
118/723 R

\* cited by examiner

SHOWERHEAD WITH INTERLACED GAS FEED AND REMOVAL AND METHODS OF USE

CROSS-REFERENCE TO RELATED APPLICATIONS

This application claims priority to U.S. Provisional Application No. 62/654,518, filed Apr. 8, 2018, the entire disclosure of which is hereby incorporated by reference herein.

TECHNICAL FIELD

The present disclosure generally relate to an apparatus and a method for providing a flow of gas into and out of a processing chamber. More specifically, embodiments of the disclosure are directed to gas distribution modules with interlaced gas feed and removal components.

BACKGROUND

In the field of semiconductor processing, flat-panel display processing or other electronic device processing, vapor deposition processes have played an important role in depositing materials on substrates. With smaller technology node, on-wafer process uniformity during steady state and transient becomes more stringent. Gas flow velocity, pressure and chemical species distributions are important for on-wafer performance. During wafer surface process, by-products are generated that changes the species composition adversely affecting wafer surface process (deposition, etch, etc.). Center feed and edge exhaust based gas distribution apparatus can lead to flow velocity and pressure variations and by-product accumulation from center to edge leading on-wafer process non-uniformity.

Therefore, there is an ongoing need in the art for improved gas distribution apparatuses, including showerheads, to supply uniform flows of gases to a substrate.

SUMMARY

One or more embodiments of the disclosure are directed to gas distribution modules comprising a housing, an inlet and an outlet. The housing has at least one side, a top, a bottom and a partition between the top and bottom. The at least one side, partition and top define an upper plenum. The at least one side, partition and bottom define a lower plenum. The inlet is in fluid communication with one of the upper plenum or the lower plenum. The outlet is in fluid communication with the other of the upper plenum or the lower plenum. A plurality of passages extends from the upper plenum, through the lower plenum and extending through the bottom of the housing to form upper openings in the bottom. The upper passages are separated from the lower plenum by an upper passage wall and provide fluid communication between the upper plenum and an outer face of the bottom of the housing. A plurality of lower passages extends through the bottom of the housing to form lower openings in the bottom. The lower passages provide fluid communication between the lower plenum and the outer face of the bottom of the housing.

Additional embodiments of the disclosure are directed to gas distribution modules comprising a housing, an inlet and an outlet. The housing has at least one side, a top, a bottom and a partition between the top and bottom. The at least one side, partition and top define an upper plenum. The at least one side, partition and bottom define a lower plenum. The inlet is in fluid communication the upper plenum and the outlet is in fluid communication with the lower plenum. A plurality of upper passages extends from the upper plenum, through the lower plenum and through the bottom of the housing to form upper openings in the bottom. The upper passages are separated from the lower plenum by an upper passage wall and provide fluid communication between the upper plenum and an outer face of the bottom of the housing. A plurality of lower passages extends through the bottom of the housing to form lower openings in the bottom. The lower passages provide fluid communication between the lower plenum and the outer face of the bottom of the housing. The lower openings are arranged so that there are three or more lower openings around each upper opening.

Further embodiments of the disclosure are directed to gas distribution modules comprising a housing, an inlet and an outlet. The housing has at least one side, a top, a bottom and a partition between the top and bottom. The at least one side, partition and top define an upper plenum. The at least one side, partition and bottom define a lower plenum. The inlet is in fluid communication with one of the upper plenum or the lower plenum. The outlet is in fluid communication with the other of the upper plenum or the lower plenum. A plurality of upper passages extends from the upper plenum, through the lower plenum and through the bottom of the housing to form upper openings in the bottom. The upper passages are separated from the lower plenum by an upper passage wall and provide fluid communication between the upper plenum and an outer face of the bottom of the housing. A plurality of lower passages extends through the bottom of the housing to form lower openings in the bottom. The lower passages provide fluid communication between the lower plenum and the outer face of the bottom of the housing. An RF feed line is in electrical communication with one of the partition to generate a plasma in the upper plenum or lower plenum, or the bottom of the housing to generate a plasma in the lower plenum or on an opposite side of the bottom than the lower plenum.

BRIEF DESCRIPTION OF THE DRAWINGS

So that the manner in which the above recited features of the disclosure are attained and can be understood in detail, a more particular description of the disclosure, briefly summarized above, may be had by reference to the embodiments thereof which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Embodiments of the disclosure are directed to gas distribution apparatus for use in chemical vapor deposition type processes. One or more embodiments of the disclosure are directed to atomic layer deposition processes and apparatus (also called cyclical deposition) incorporating the gas distribution apparatus described. The gas distribution apparatus described may be referred to as a showerhead or gas distribution plate, but it will be recognized by those skilled in the art that the apparatus does not need to be shaped like a showerhead or plate. The terms "showerhead" and "plate" should not be taken as limiting the scope of the disclosure.

In one or more embodiments of the disclosure, feed gas carrying chemical species from a recursive feed structure comes to an upper plenum (or lower plenum in a different configuration). The gas flows through multiple tubes (inlets) from the upper plenum across the lower plenum to the process region. The process gas interacts with the wafer surface leading to surface processing (deposition or etch). The process gas with by-products is removed through the exhaust tubes that are interlaced with the inlets. In this manner, by-products (which include reaction products) are removed locally minimizing variation of chemical species across the wafer. The exhaust tubes are connected to the lower plenum (or upper plenum in a different configuration). The lower plenum for exhaust is recursively connected to the pump port. Each part of the wafer "sees" similar steady state and transient response of the variables in terms of chemical species, flow velocity and pressure, improving on-wafer process uniformity and exposure time.

One or more embodiments of the disclosure advantageously provide gas distribution modules that allow each part of the wafer to see a similar environment in terms of chemical species, flow velocity and pressure. Some embodiments reduce by-products due to chemical reaction (on the wafer surface) by pumping out the by-products, locally minimizing variation of chemical species across the wafer. Some embodiments advantageously provide uniform exposure time of chemical species. In some embodiments, saturation of chemical species occurs almost simultaneously across the wafer minimizing the need for over-exposure. Some embodiments reduce the overall exposure time to the wafers, increasing overall throughput.

Figure 1:
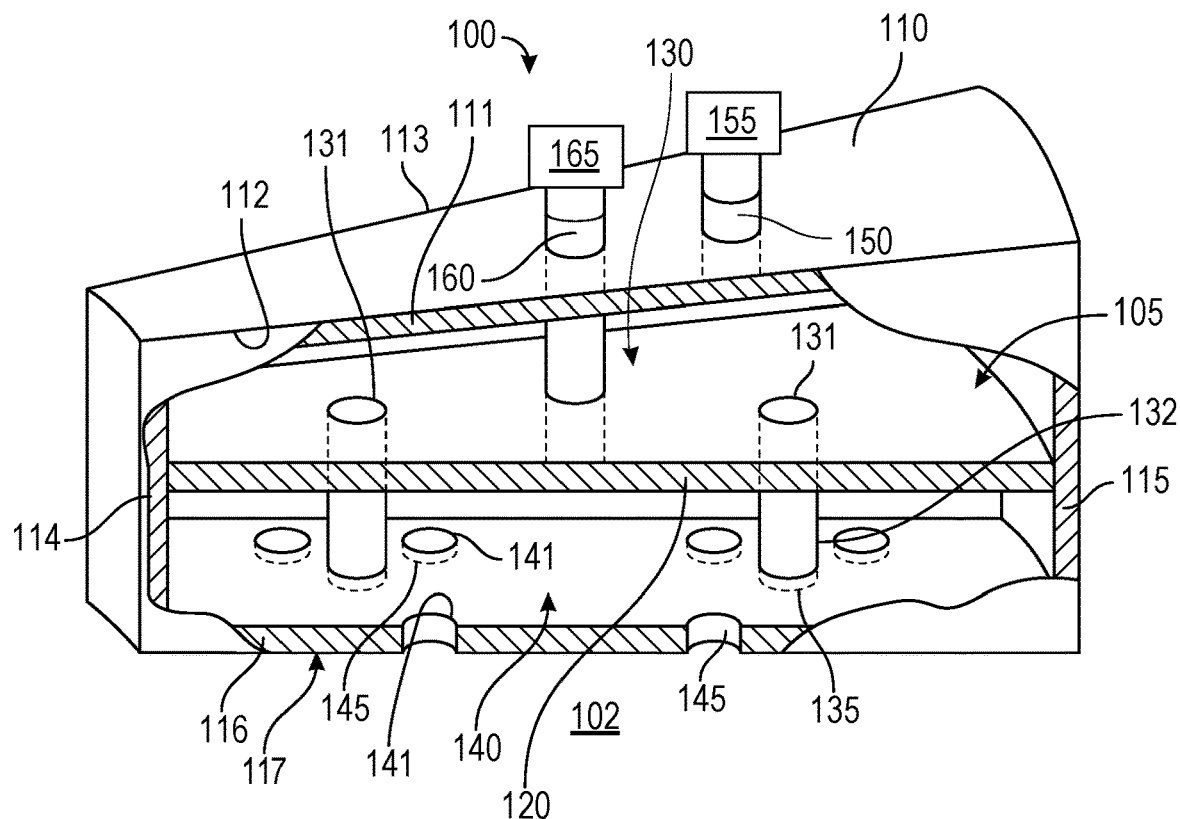
FIG. 1 shows a view of a gas distribution module with cutaway portion in accordance with one or more embodiments of the disclosure.

FIG. 1 illustrates an embodiment of a gas distribution module 100 in accordance with one or more embodiment of the disclosure. A housing 110 illustrated with a cutout portion 105 to show a portion of the inside of the housing. The housing 110 illustrated is a wedge-shaped component that can be incorporated into a larger gas distribution assembly by combining various wedge-shaped components to form a circular gas distribution system. In some embodiments, the housing 110 is a circular shaped component that can be used without additional components.

The housing 110 of some embodiments has at least one side, a top and a bottom. For example, a round housing would have one continuous side; whereas a wedge-shaped housing would have four sides, as described with respect to FIG. 1. The housing 110 illustrated has a top 111, first side 112, second side 113 (collectively referred to as sides), an inner peripheral end 114, an outer peripheral end 115 and a bottom 116. Each of the top, bottom and sides has an inner face and an outer face defining a thickness.

The housing has a partition 120 separating the inside of the housing into an upper plenum 130 and a lower plenum 140. The partition has a first side and a second side defining a thickness. The upper plenum 130 is defined by the top 111 of the housing 110 and partition 120. The lower plenum 140 is defined by the partition 120 and the bottom 116. The skilled artisan will recognize that the plenums are bounded by more than a top and bottom boundary. In the wedge-shaped embodiment illustrated, the sides 112, 113 and ends 114, 115 form lateral boundaries of the plenums 130, 140. In an embodiment with a circular shape (not shown), the wall is continuous, forming the lateral boundaries of the plenums.

An inlet 150 is in fluid communication with one of the upper plenum 130 or the lower plenum 140. An outlet 160 is in fluid communication with the other of the upper plenum 130 or lower plenum 140 than the inlet 150. In the illustrated embodiment the inlet 150 is in fluid communication with the upper plenum 130 and the outlet is in fluid communication with the lower plenum 140. In some embodiments, the inlet is in fluid communication with the lower plenum and the outlet is in fluid communication with the upper plenum.

The inlet 150 is a gas source 155 to provide a flow of gas into the plenum. The outlet 160 is a vacuum source 165 to provide a vacuum stream to draw gases out of the plenum connected to the outlet. In some embodiments, the gas distribution module 100 includes one or more of a gas source 155 or vacuum source 165.

The upper plenum 130 includes a plurality of upper passages 131 extending from the upper plenum 130, through the lower plenum 140 and extending through the bottom 116 of the housing to form upper openings 135 in the bottom 116. The upper passages 131 are separated from the lower plenum 140 by an upper passage wall 132. The upper passages 131 provide fluid communication between the upper plenum 130 and the outer face 117 of the bottom 116 of the housing 110. The outer face 117 is also referred to as the portion of the bottom 116 opposite the lower plenum 140.

The lower plenum 140 includes a plurality of lower passages 141 extending through the bottom 116 of the housing 110 to form lower openings 145 in the bottom 116. The lower passages 141 provide fluid communication between the lower plenum 140 and the outer face 117 of the bottom 116 of the housing 110.

In use, a gas source 155 (e.g., gas cylinder) can be connected to the inlet 150 and a vacuum source 165 (e.g., vacuum pump or foreline) connected to the outlet 160. The gas source 155 provides a flow of gas into the upper plenum 130 (in the illustrated embodiment). The gas pressure in the upper plenum 130 reaches a steady state. The gas in the upper plenum 130 flows through the upper passages 131 out the outer face 117 of the housing 110 into a process region 102 located on the opposite side of the bottom 116 than the lower plenum 140.

Figure 2:
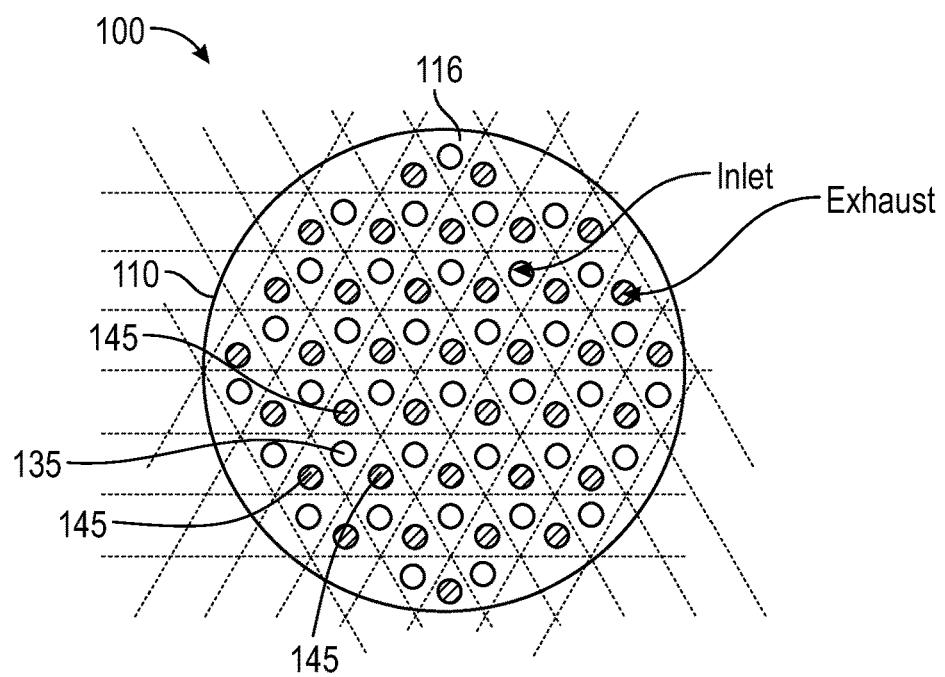
FIG. 2 shows an embodiment of a gas distribution module in accordance with one or more embodiment of the disclosure.

The arrangement of openings 135, 145 in the bottom 116 of the module housing 110 can have an effect on the overall efficiency of the gas flows. In some embodiments, each of the upper openings 135 is surrounded by three lower openings 145 and each of the lower openings 145 is surrounded by three upper openings 135. This can be seen in the embodiment illustrated in FIG. 2, which shows a view of the bottom 116 of a gas distribution module 100 with a round housing 110. As used in this manner, the term "surrounded by" means that the closest openings to the subject opening are the stated opening. For example, an upper opening 135 is labeled in FIG. 2 and shows that the three closes openings are lower openings 145. The grid lines shown in FIG. 2 are for illustrative purposes only to show the arrangement of openings 135, 145.

Figure 3:
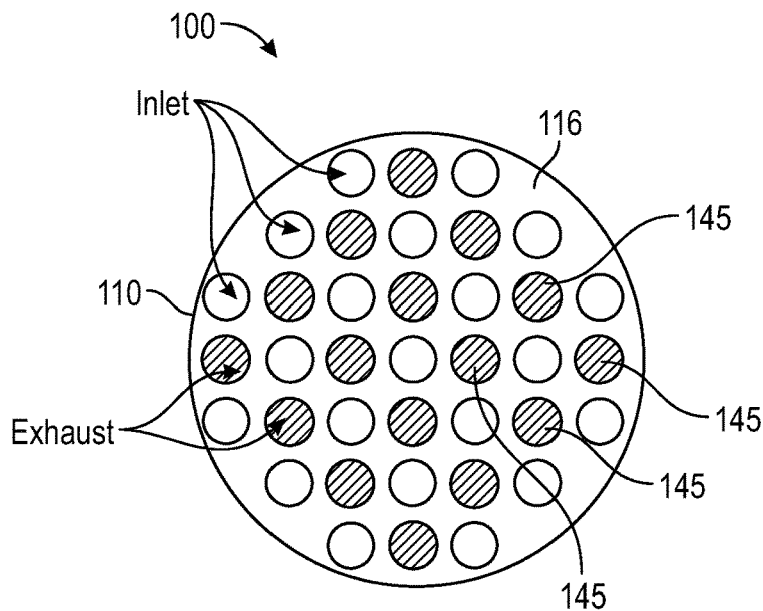
FIG. 3 shows an embodiment of a gas distribution module in accordance with one or more embodiment of the disclosure.

In some embodiments, each of the upper openings 135 is surrounded by four, five or six lower openings 145 and each of the lower openings 145 are surrounded by the same number of upper openings 135. For example, FIG. 3 illustrates an embodiment in which the upper opening 135 is surrounded by four lower openings 145 and each lower opening 145 is surrounded by four upper openings 135. In some embodiments, there are an equal number of lower openings 145 as upper openings 135. In some embodiments, there are a different number of lower openings 145 than upper openings 135.

Figure 4:
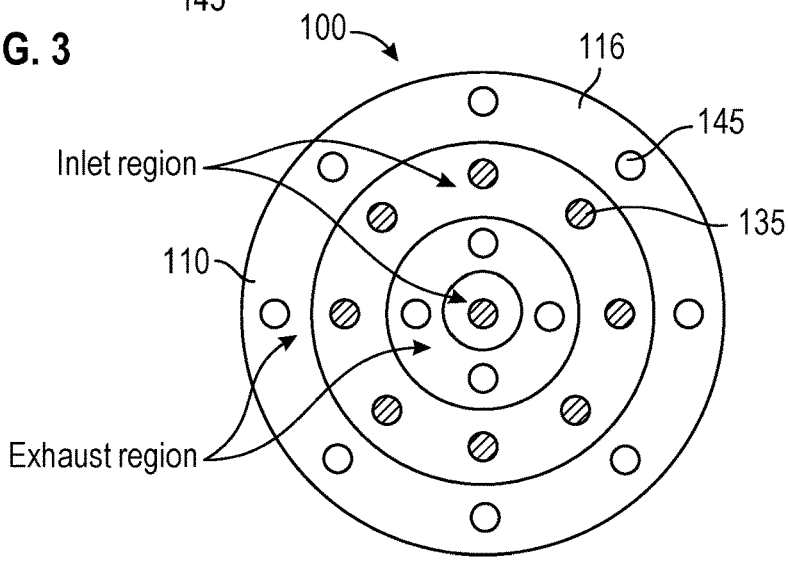
FIG. 4 shows an embodiment of a gas distribution module in accordance with one or more embodiment of the disclosure.

FIG. 4 illustrates another embodiment of the disclosure in which the upper openings 135 are arranged in circular zones alternating with circular zones of lower openings 145. In some embodiments, each upper opening 135 has a lower opening 145 closer than another upper opening 135. The illustrated embodiment has four zones: innermost zone 170*a* has one upper opening 135; zone 170*b* is around innermost zone 170*a* and has four lower openings 145; zone 170*c* is around zone 170*b* and has eight upper openings 135; and zone 170*d* is around zone 170*c* and has eight lower openings 145. Although four zones are shown, the skilled artisan will recognize that this is merely representative of one possible arrange and the size, number and spacing the zones can be varied and the number of openings in each zone can be varied.

Figure 5:
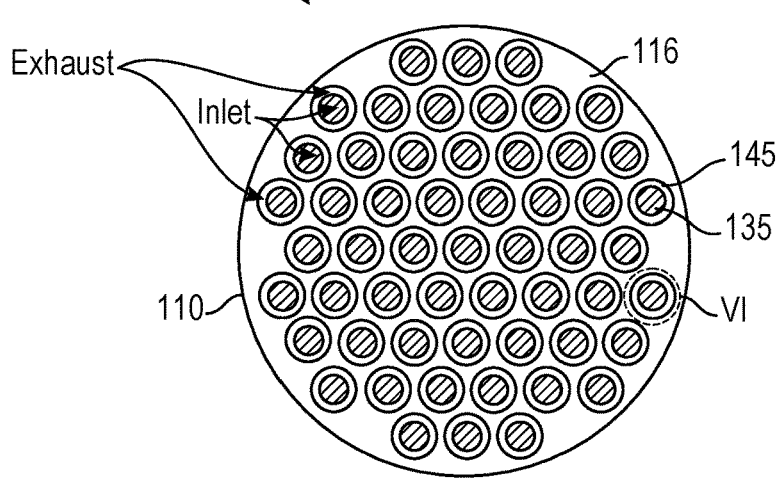
FIG. 5 shows an embodiment of a gas distribution module in accordance with one or more embodiment of the disclosure.
Figure 6:
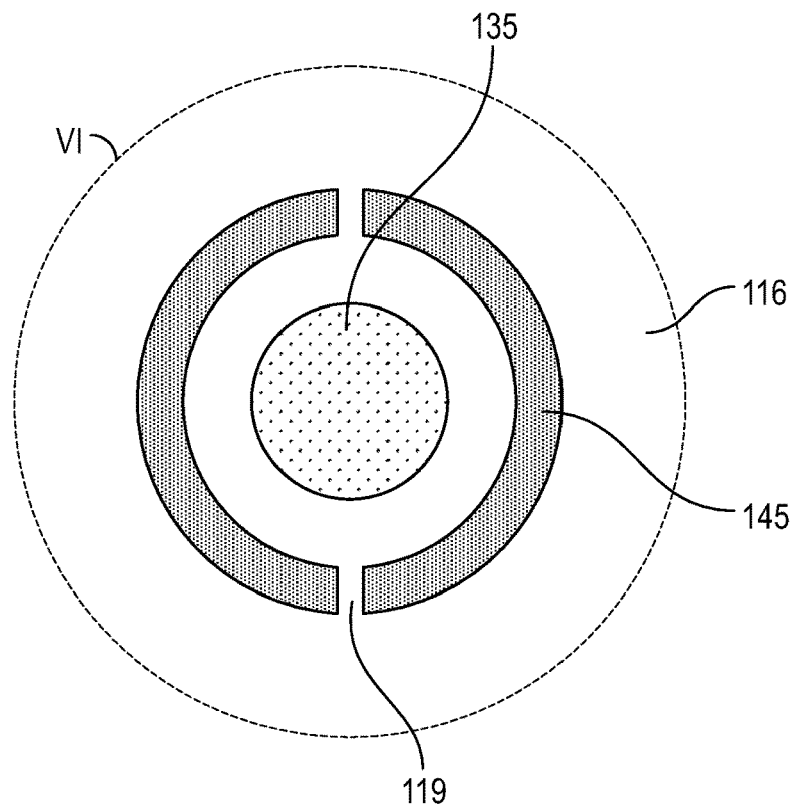
FIG. 6 shows an expanded view of region VI of FIG. 5.

In some embodiments, one of the lower openings 145 or upper openings 135 bound the other of the lower openings 145 or upper opening 135. For example, FIG. 5 illustrates an embodiment of a gas distribution module 100 in which each upper openings 135 is bounded by a ring-shaped lower opening 145. Stated differently, in some embodiments, the openings in fluid communication with the inlet 150 (through the intervening plenum and passage) are bounded by the openings in fluid communication with the outlet 160 (through the intervening plenum and passage). Region VI in FIG. 5 is shown expanded in FIG. 6. The lower opening 145 is shown as a ring-shaped opening with two bridges 119. The bridges 119 may be included to connect the portion of the bottom 116 between the circular upper opening 135 and the ring shaped lower opening 145 with the remaining portion of the housing 110. The embodiment illustrated has two bridges 119; however it will be recognized that there can be more or less bridges 119.

Figure 7:
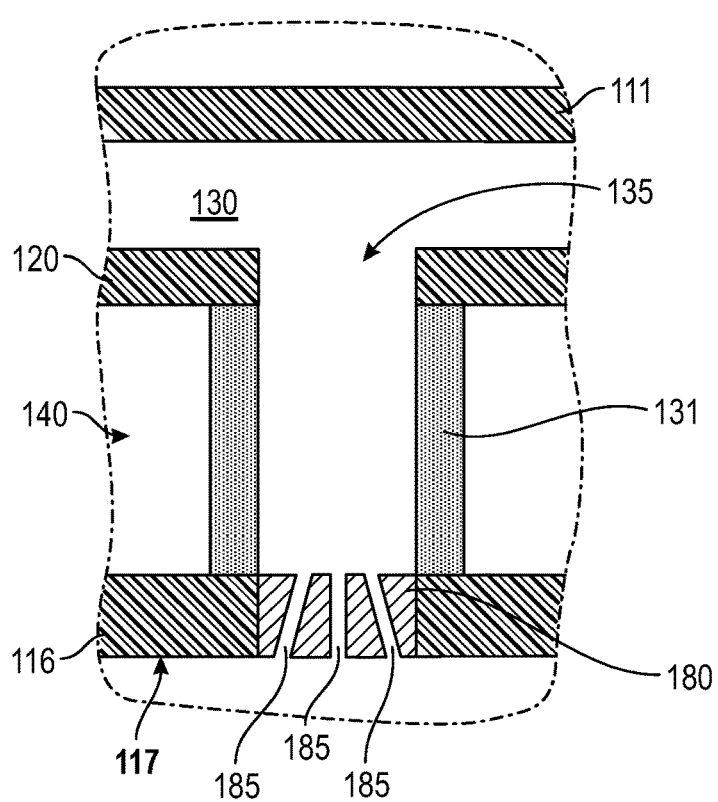
FIG. 7 shows a partial cross-sectional schematic of a gas distribution module in accordance with one or more embodiment of the disclosure.
Figure 8:
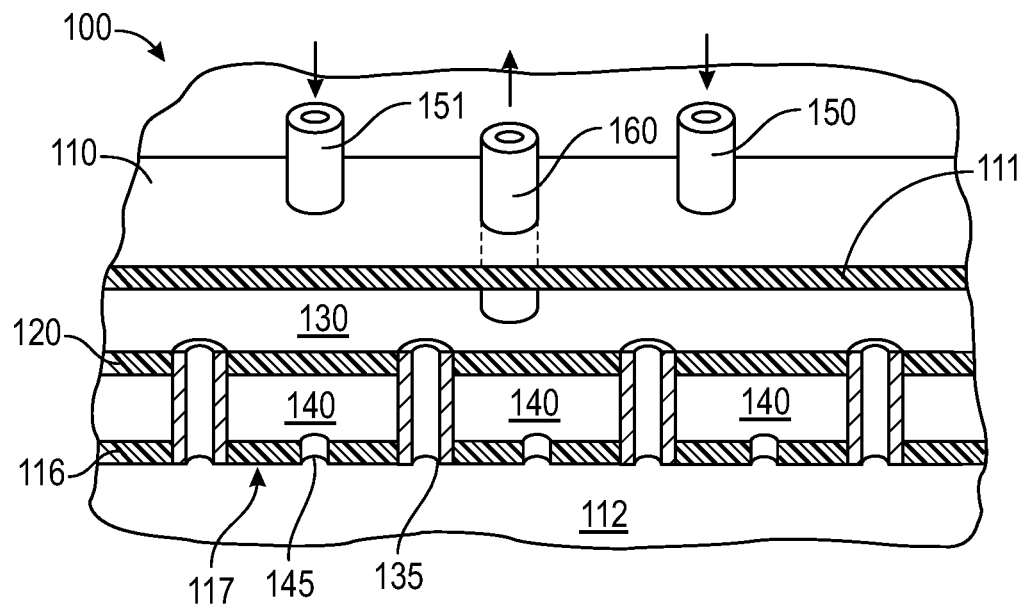
FIG. 8 shows a partial cross-sectional schematic view of a gas distribution module in accordance with one or more embodiment of the disclosure.

In some embodiments, the openings in fluid communication with the inlet 150 have a diffusion plate 180 at the bottom 116 of the housing 110. FIG. 7 illustrates a cross-sectional view of an embodiment in which a diffusion plate 180 with apertures 185 are positioned at the bottom 116 of the housing 110 aligned with the upper openings 135. In some embodiments, the diffusion plate 180 has a plurality of apertures to separate the flow of gas through the opening 135 into multiple flows. The number of apertures can vary. In some embodiments, there are one or more apertures 185 in the diffusion plate 180 for each of the upper openings 135 and/or each of the lower openings 145. In some embodiments, there are in the range of about 1 to about 15 apertures 185 in the diffusion plate 180. In some embodiments, at least one of the apertures 185 is oriented at an angle to at least one aperture 185 to provide non-parallel flows of gases through the apertures. The diffusion plate 180 shown in FIG. 7 has three apertures 185 with the center aperture directing a flow normal to the diffusion plate 180 with the opening 135 and the outer apertures 185 direct flows outward, relative to the center aperture, so that the flow are non-parallel. The angle of the apertures can be any suitable angle. In some embodiments, the angle is in the range of about 0° to about 80° relative to the diffusion plate 180 normal.

Figure 9:
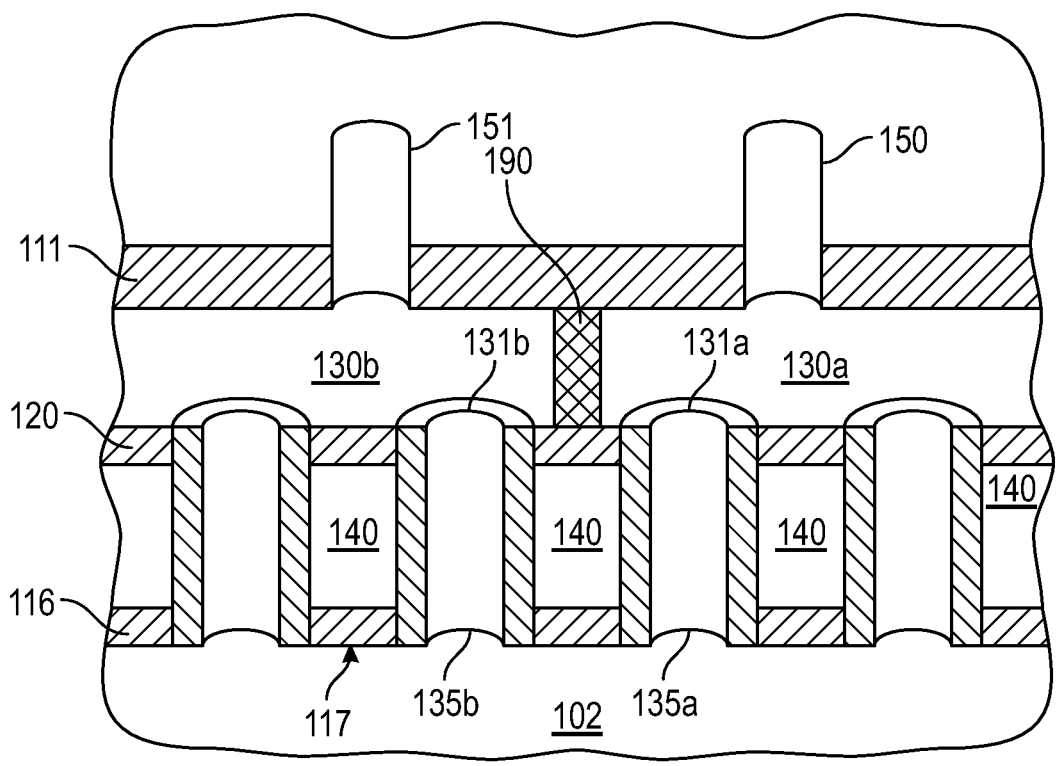
FIG. 9 shows a partial cross-sectional schematic view of a gas distribution module in accordance with one or more embodiment of the disclosure.

FIG. 9 shows another embodiment of the disclosure in which the module 100 includes a second inlet 151 in fluid communication with one of the upper plenum 130 (as shown) or the lower plenum 140 (not shown). The second inlet 151 can provide a flow of the same gas as the inlet 150 or a different gas. For example, in a CVD type process, the inlet 150 and second inlet 151 may provide different reactive species which can react in the upper plenum 130, flow through the upper openings 135 into the reaction space of the process region 102. In some embodiments, the second inlet 151 provides a flow of diluent gas into the plenum. In some embodiments, as shown in FIG. 9, the second inlet 151 flows into upper plenum 130 which is split by divider 190 into a first plenum 130*a* and a second plenum 130*b*. The outlet 160 and lower openings are not illustrated in this Figure for clarity purposes only.

Figure 10A:
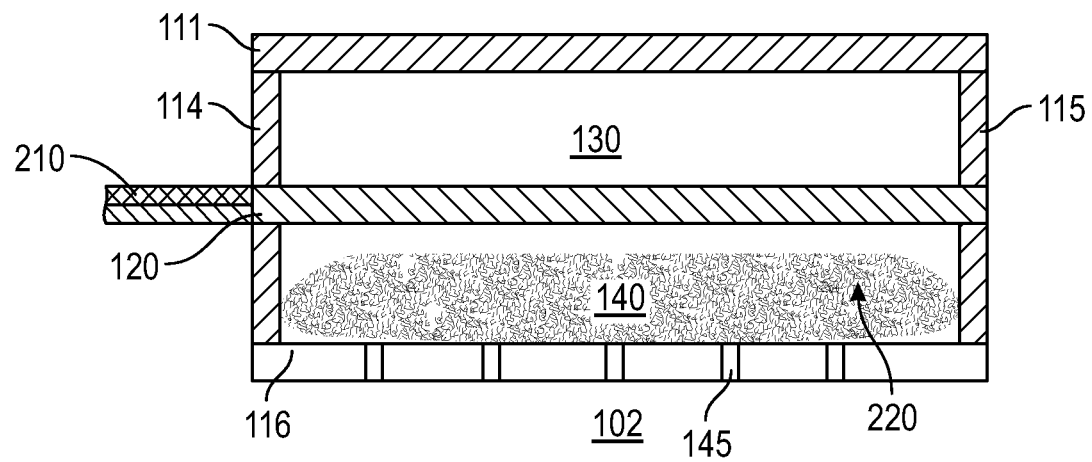
FIG. 10A shows a cross-sectional schematic view of a gas distribution module with an RF powered partition in accordance with one or more embodiment of the disclosure.

Some embodiments of the disclosure provide gas distribution modules 100 that can be used in plasma enhanced processes. In FIG. 10A the partition 120 is connected to an RF feed line 210 (e.g., a coaxial feed line) and the bottom 116 of the housing 110 is electrically grounded (or held at a different potential than the partition). The sides and top of the housing are made of a suitable dielectric material. In this embodiment, energizing the partition 120 can result in formation of a plasma 220 in the lower plenum 140. A suitable height for plenum 140 is chosen to generate plasma in lower plenum 140 while a different height is chosen for upper plenum 130 not to generate plasma in upper plenum. The plasma species can flow through the lower openings 145 into the process region 102. Embodiments of FIG. 10A are also referred to as remote plasma sources (RPS) because the plasma is generated remotely from the processing region 102.

Figure 10B:
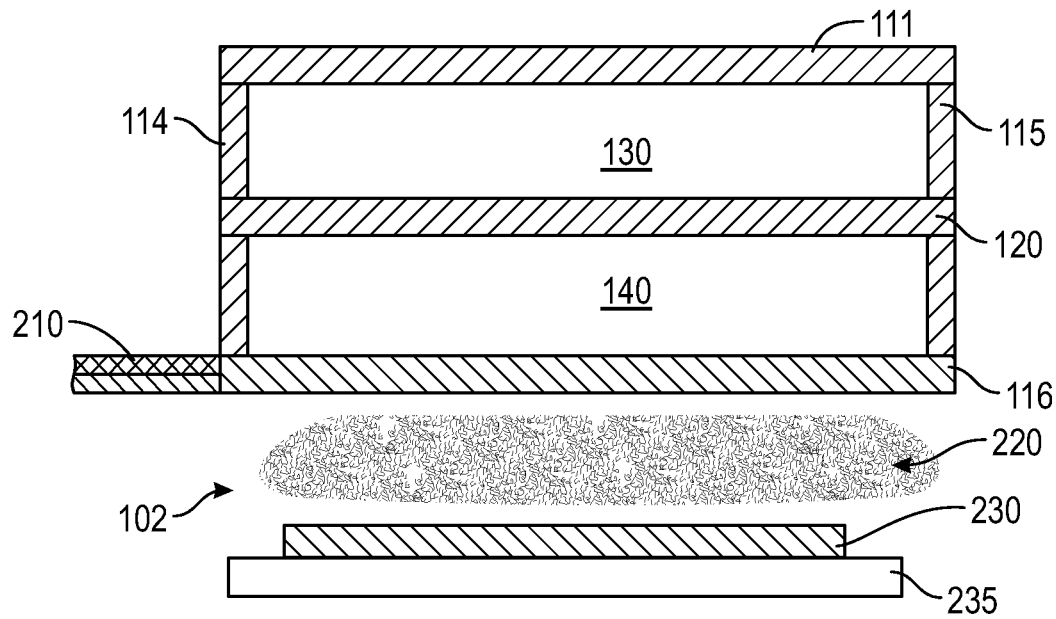
FIG. 10B shows a cross-sectional schematic view of a gas distribution module with an RF powered bottom in accordance with one or more embodiment of the disclosure.

In another embodiment, as shown in FIG. 10B, the bottom 116 of the housing 110 is connected to an RF feed line 210 and the partition 120, top 111 and ends 114, 115 are non-conductive. In this embodiment, the substrate 230 or pedestal 235 can act as the ground electrode (or be held at a different potential than the bottom 116) so that a plasma 220 is generated in the processing region 102. In some embodiments, the heights of upper plenum 130 and lower plenum 140 are suitably chosen not to generate plasma therein. Stated differently, the plasma 220 is generated on an opposite side of the bottom 116 than the lower plenum 140. Embodiments of the type shown in FIG. 10B in which the substrate or pedestal act as an electrode for plasma generation are also referred to as a direct plasma.

Figure 10C:
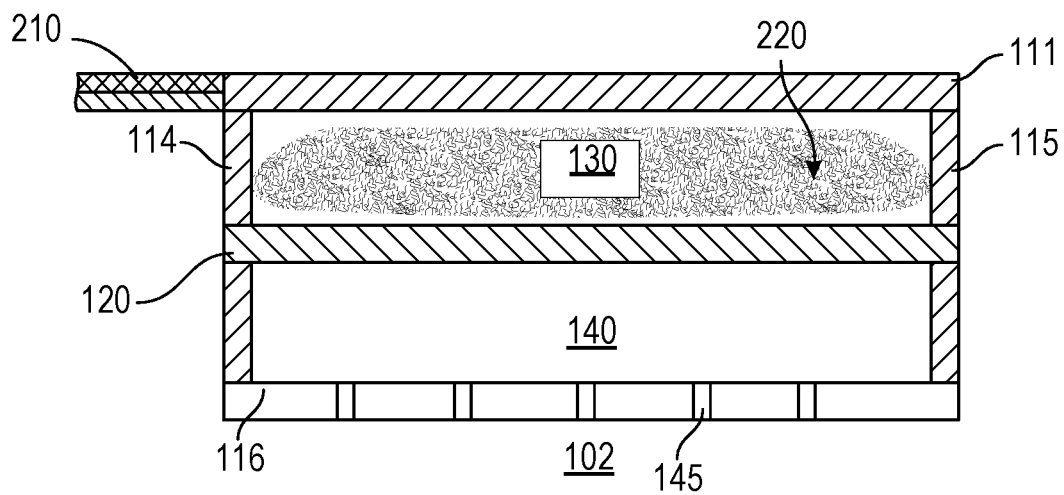
FIG. 10C shows a cross-sectional schematic view of a gas distribution module with an RF powered top in accordance with one or more embodiment of the disclosure.

In another embodiment, as shown in FIG. 10C, the top 111 of the housing 110 is connected to an RF feed line 210 and the partition 120 and ends 114, 115 are non-conductive. In this embodiment, the partition 120 can act as the ground electrode (or can be held at a different potential than the top 111) so that a plasma 220 is generated in the upper plenum 130. A suitable height for plenum 130 is chosen to generate plasma in upper plenum 130 while a different height can be chosen for lower plenum 140 to prevent plasma ignition in the lower plenum 140. The plasma species can flow from the upper plenum 130 into the process region 102.

The gas distribution module 100 can be used to form one or more layers during a plasma enhanced atomic layer deposition (PEALD) or plasma enhanced chemical vapor deposition (PECVD) process. In some processes, the use of plasma provides sufficient energy to promote a species into the excited state where surface reactions become favorable and likely. Introducing the plasma into the process can be continuous or pulsed. The plasma may be generated via any suitable plasma generation process or technique known to those skilled in the art. For example, plasma may be generated by one or more of a microwave (MW) frequency generator or a radio frequency (RF) generator. The frequency of the plasma may be tuned depending on the specific reactive species being used. Suitable frequencies include, but are not limited to, 2 MHz, 13.56 MHz, 40 MHz, 60 MHz, 100 MHz, 121 MHz and 162 MHz. Although plasmas may be used during the deposition processes disclosed herein, it should be noted that plasmas may not be required.

Figure 11:
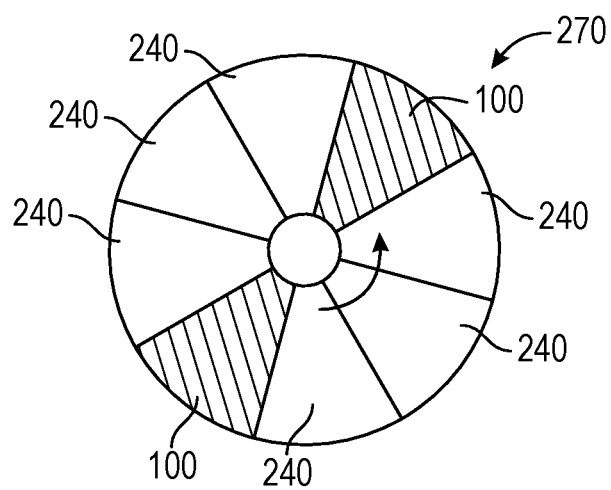
FIG. 11 shows a gas distribution assembly incorporating gas distribution modules according to one or more embodiment of the disclosure.

In some embodiments, the gas distribution module 100 is a wedge-shaped component that is combined with other wedge-shaped modules to form a circular or disc-shaped gas distribution assembly. FIG. 11 shows a gas distribution assembly 270 comprising at least one gas distribution module 100 (two are shown) and a plurality of injector units 240 combined to make a circular assembly. A substrate can be rotated along a circular path beneath each of the gas distribution modules 100 and injector units 240 to be exposed to a plurality of different processing regions to deposit or remove a film from the substrate. Some embodiments of the disclosure are directed to processing chambers comprising the gas distribution module 100.

Although the invention herein has been described with reference to particular embodiments, it is to be understood that these embodiments are merely illustrative of the principles and applications of the present invention. It will be apparent to those skilled in the art that various modifications and variations can be made to the method and apparatus of the present invention without departing from the spirit and scope of the invention. Thus, it is intended that the present invention include modifications and variations that are within the scope of the appended claims and their equivalents.

What is claimed is:

1. A gas distribution module comprising:
a housing having at least one side, a top, a bottom and a partition between the top and the bottom, an upper plenum defined by the at least one side, the partition and the top, and a lower plenum defined by the at least one side, the partition and the bottom;
a gas source connected to an inlet connected to one of the upper plenum or the lower plenum to provide a flow of gas through the upper plenum or the lower plenum to a process region;
a vacuum source connected to an outlet connected to the other of the upper plenum or the lower plenum to provide a vacuum stream to draw gases from the process region through the other of the upper plenum or the lower plenum;
a plurality of upper passages extending from the upper plenum, through the lower plenum and extending through the bottom of the housing to form a plurality of upper openings in the bottom, the upper passages separated from the lower plenum by an upper passage wall and providing fluid communication between the upper plenum and the process region; and
a plurality of lower passages extending through the bottom of the housing to form a plurality of lower openings in the bottom, the plurality of lower passages providing fluid communication between the lower plenum and the process region.

2. The gas distribution module of claim 1, wherein the inlet is connected to the lower plenum and the outlet is connected to the upper plenum.

3. The gas distribution module of claim 1, wherein the inlet is connected to the upper plenum and the outlet is connected to the lower plenum.

4. The gas distribution module of claim 1, wherein each of the plurality of upper openings in the bottom is surrounded by three or more of the plurality of lower openings in the bottom and each of the plurality of lower openings in the bottom is surrounded by three or more of the plurality of upper openings.

5. The gas distribution module of claim 1, wherein the plurality of upper openings is arranged in circular zones alternating with circular zones of the plurality of lower openings.

6. The gas distribution module of claim 1, wherein at least one of the plurality of lower openings or at least one of the plurality of upper openings surrounds the other of the plurality of lower openings or the plurality of upper openings to form ring shaped openings.

7. The gas distribution module of claim 6, wherein the plurality of upper openings or the plurality of lower openings connected, respectively, to the upper plenum or lower plenum connected to the inlet are surrounded by the other of the plurality of upper openings or the plurality of lower openings connected to the plenum connected to the outlet.

8. The gas distribution module of claim 1, wherein the plurality of upper openings or the plurality of lower openings connected, respectively, to the upper plenum or lower plenum connected to the inlet have a diffusion plate at the bottom of the housing the diffusion plate having a plurality of apertures separating a flow of gas in the plurality of upper openings or the plurality of lower openings into multiple flows.

9. The gas distribution module of claim 8, wherein the diffusion plate comprises at least one aperture oriented at an angle to at least one other aperture to provide non-parallel flows of gases through apertures.

10. The gas distribution module of claim 1, further comprising a second inlet connected to a second gas source.

11. The gas distribution module of claim 10, wherein the second inlet is connected to the same plenum as that of the inlet.

12. The gas distribution module of claim 10, wherein the second inlet is connected to a different plenum than that of the inlet.

13. The gas distribution module of claim 10, wherein the upper plenum or the lower plenum that the second inlet is connected to further comprises one or more divider to split the upper plenum or the lower plenum into a first upper plenum or first lower plenum and a second upper plenum or second lower plenum.

14. The gas distribution module of claim 1, wherein the partition is in electrical connection with an RF feed line and the bottom is electrically grounded to generate a plasma in the lower plenum.

15. The gas distribution module of claim 1, wherein the bottom of the housing is in electrical connection with an RF feed line to generate a plasma in the process region.

16. The gas distribution module of claim 1, wherein the top of the housing is in electrical connection with an RF feed line to generate a plasma in the upper plenum.

17. A gas distribution module comprising:
a housing having at least one side, a top, a bottom and a partition between the top and the bottom, the at least one side, an upper plenum defined by the partition and the top defining, and a lower plenum defined by the at least one side, the partition and the bottom;
at least one inlet connected to the upper plenum and configured to be connected to a gas source to provide a flow of gas through the upper plenum to a process region;
at least one outlet connected to the lower plenum and a vacuum source to provide a vacuum stream to draw gases from the process region through the lower plenum;
a plurality of upper passages extending from the upper plenum, through the lower plenum and extending through the bottom of the housing to form a plurality of upper openings in the bottom, the upper passages separated from the lower plenum by an upper passage wall and providing fluid communication between the upper plenum and the process region; and
a plurality of lower passages extending through the bottom of the housing to form a plurality of lower openings in the bottom, the plurality of lower passages providing fluid communication between the lower plenum and the process region, the plurality of lower openings arranged so that there are three or more of the plurality of lower openings around each of the plurality of upper openings.

18. The gas distribution module of claim 17, wherein the plurality of upper openings have a diffusion plate at the bottom of the housing, the diffusion plate having a plurality of apertures separating a flow of gas in the plurality of upper openings into multiple flows.

19. The gas distribution module of claim 18, wherein the diffusion plate comprises at least one aperture oriented at an angle to at least one other aperture to provide non-parallel flows of gases through apertures.

20. A gas distribution module comprising:
a housing having at least one side, a top, a bottom and a partition between the top and the bottom, the at least one side, an upper plenum defined by the partition and the top, and a lower plenum defined by the at least one side, the partition and the bottom;
at least one inlet connected to one of the upper plenum or the lower plenum and a gas source to provide a flow of gas through the upper plenum or the lower plenum to a process region;
at least one outlet connected to the other of the upper plenum or the lower plenum and a vacuum source to provide a vacuum stream to draw gases from the process region through the other of the upper plenum or the lower plenum;
a plurality of upper passages extending from the upper plenum, through the lower plenum and extending through the bottom of the housing to form a plurality of upper openings in the bottom, the upper passages separated from the lower plenum by an upper passage wall and providing fluid communication between the upper plenum and the process region;
a plurality of lower passages extending through the bottom of the housing to form a plurality of lower openings in the bottom, the plurality of lower passages providing fluid communication between the lower plenum and the process region; and
an RF feed line in electrical communication with the partition to generate a plasma in the upper plenum or lower plenum or the bottom of the housing to generate a plasma in the lower plenum or the process region.

* * * * *